(12) United States Patent
Matsushita et al.

(10) Patent No.: US 8,944,310 B2
(45) Date of Patent: Feb. 3, 2015

(54) METHOD OF MANUFACTURING A SEMICONDUCTOR DEVICE

(71) Applicant: Fuji Electric Co., Ltd., Kawasaki-shi, Kanagawa-ken (JP)

(72) Inventors: Takeshi Matsushita, Matsumoto (JP); Eiji Mochizuki, Matsumoto (JP); Tatsuo Nishizawa, Matsumoto (JP); Shunsuke Saito, Tokyo (JP)

(73) Assignee: Fuji Electric Co., Ltd., Kawasaki-shi (JP)

(*) Notice: Subject to any disclaimer, the term of this patent is extended or adjusted under 35 U.S.C. 154(b) by 0 days.

(21) Appl. No.: 14/175,339

(22) Filed: Feb. 7, 2014

(65) Prior Publication Data

US 2014/0224862 A1    Aug. 14, 2014

(30) Foreign Application Priority Data

Feb. 14, 2013    (JP) .................... 2013-026593

(51) Int. Cl.
*B23K 31/02*    (2006.01)
*H01L 23/00*    (2006.01)

(52) U.S. Cl.
CPC ...................... *H01L 24/83* (2013.01)
USPC .......................... 228/220; 228/246

(58) Field of Classification Search
None
See application file for complete search history.

(56) References Cited

U.S. PATENT DOCUMENTS

| | | | | |
|---|---|---|---|---|
| 4,020,987 A | * | 5/1977 | Hascoe | 228/56.3 |
| 4,076,637 A | * | 2/1978 | Hurst | 508/150 |
| 4,506,822 A | * | 3/1985 | Hammersand et al. | 228/200 |
| 4,705,205 A | * | 11/1987 | Allen et al. | 228/180.22 |
| 5,620,129 A | * | 4/1997 | Rogren | 228/56.3 |
| 5,680,985 A | * | 10/1997 | Wentworth | 228/246 |
| 6,344,407 B1 | * | 2/2002 | Matsuki et al. | 438/613 |
| 6,593,526 B2 | * | 7/2003 | Takeda | 174/535 |
| 7,967,185 B2 | * | 6/2011 | Sato et al. | 228/234.1 |
| 2002/0076909 A1 | * | 6/2002 | Matsuki et al. | 438/612 |
| 2002/0130164 A1 | * | 9/2002 | Matsuki et al. | 228/206 |
| 2003/0222126 A1 | * | 12/2003 | Morozumi et al. | 228/219 |
| 2004/0113215 A1 | * | 6/2004 | Shimada et al. | 257/414 |
| 2007/0044295 A1 | * | 3/2007 | Chen | 29/592.1 |
| 2008/0078145 A1 | * | 4/2008 | Tu et al. | 53/404 |
| 2009/0186215 A1 | * | 7/2009 | Sato et al. | 428/336 |

(Continued)

FOREIGN PATENT DOCUMENTS

EP    07-47160 A2    * 12/1996
JP    34-44832 B2    *  9/2003

(Continued)

OTHER PUBLICATIONS

Machine translation of JP-2006-116564A (no date available).*

(Continued)

*Primary Examiner* — Kiley Stoner
(74) *Attorney, Agent, or Firm* — Manabu Kanesaka

(57) ABSTRACT

A soldering method achieves little void and good joint condition in soldering an insulated circuit board and a semiconductor chip using a tin-high antimony solder material. A method of manufacturing a semiconductor device includes the steps of preparing a solder plate having a U-shape; mounting the solder plate on a substrate; mounting a semiconductor chip on the solder plate; fusing the solder plate in a reducing gas atmosphere; and reducing a pressure of the reducing gas atmosphere to a pressure lower than the atmospheric pressure when melting the solder plate.

8 Claims, 4 Drawing Sheets

(56) References Cited

U.S. PATENT DOCUMENTS

| | | | |
|---|---|---|---|
| 2009/0218386 A1* | 9/2009 | Kimbara et al. | 228/103 |
| 2010/0122997 A1* | 5/2010 | Liu | 228/203 |
| 2010/0320258 A1* | 12/2010 | Sawada et al. | 228/180.22 |
| 2012/0273559 A1* | 11/2012 | Patterson et al. | 228/221 |
| 2013/0014801 A1* | 1/2013 | Chen et al. | 136/244 |
| 2013/0200136 A1* | 8/2013 | Besshi et al. | 228/219 |

FOREIGN PATENT DOCUMENTS

| | | |
|---|---|---|
| JP | 2006-116564 A | 5/2006 |
| JP | 2009-272554 A | 11/2009 |
| WO | WO 2012/164776 A1 * | 12/2012 |

OTHER PUBLICATIONS

Machine translation of JP-2009-272554A (no date available).*

* cited by examiner

METHOD OF MANUFACTURING A SEMICONDUCTOR DEVICE

CROSS-REFERENCE TO RELATED APPLICATION

This application is based on, and claims priority to, Japanese Patent Application No. 2013-026593, filed on Feb. 14, 2013, contents of which are incorporated herein by reference.

BACKGROUND OF THE INVENTION

1. Field of the Invention

The present invention relates to a method of manufacturing a semiconductor device, in particular to a method of soldering an object to be soldered.

2. Description of the Related Art

In a method of manufacturing a semiconductor device called a power semiconductor module including semiconductor chips such as an insulated gate bipolar transistor (IGBT) and a free-wheeling diode (FWD), the soldering technique is often employed for joining the semiconductor chip and an insulated circuit board.

Most soldering techniques employ soldering flux in order to prevent the surfaces of the solder and semiconductor chips from oxidization and to improve wettability of the solder. The soldering flux, however, has a problem that the soldering flux contaminates an insulated circuit board and inside parts of a reflow furnace in which the solder is heated and melted. Accordingly, Patent Document 1 discloses a method for improving wettability of solder without using solder flux, in which the oxide film on the object to be soldered is removed with hydrogen gas introduced into the reflow furnace utilizing the reaction of reducing oxygen with the hydrogen gas: $2H_2 + O_2 \rightarrow 2H_2O$.

In the soldering technique disclosed in Patent Document 1, a sheet of solder is put on a joint surface of one of the two objects to be soldered, for example, an insulated circuit board, and the other object to be soldered, for example, a semiconductor chip, is put on the sheet of solder. The assembly is heated at a temperature higher than the melting point of the solder while supplying a reducing gas, hydrogen, for example, and then cooled down. In this soldering technique, gas of free radical, hydrogen radical, for example, supplied onto the solder and the object to be soldered reduces the oxide contained in the molten solder and at the same time reduces the joint surface of the objects to be soldered to clean the surface. This procedure improves wettability of the solder.

In order to enhance the reducing reaction with the hydrogen in this technique, the joint surfaces need to be effectively supplied with hydrogen gas in the process of melting the solder. If a flat solder plate is placed between an insulated circuit board and a semiconductor chip, the solder plate contacts without a gap with the insulated circuit board and with the semiconductor chip. Thus, hydrogen gas is not sufficiently supplied onto the joint surfaces of the insulated circuit board and the semiconductor chip.

Accordingly, Patent Document 1 discloses a soldering method that forms projections at outer peripheral places of the solder sheet to increase an area of the junction surface contacting hydrogen gas, thereby enhancing the reducing effect. As recent operating environment for power semiconductor modules became severe, the solder joint surface also became required for higher strength and higher heat resistance. Accordingly, solder material of a tin-high antimony (Sn—Sb) system is being applied in place of the traditionally used solder material of the tin-silver (Sn—Ag) system.

The solder material of tin-high antimony system, however, forms a thick oxide film on the surface of the solder plate and shows poor wettability. As a result, a problem is reported that traditional soldering techniques cannot sufficiently reduce the oxide film on the surface and a void is apt to be generated due to the oxide film on the solder joint surface. Under a condition of actual operation of a power semiconductor module connected to a load, in particular, if a void is generated on the solder joint surface in the central region of the semiconductor chip, the temperature of the heated semiconductor chip rises due to the thermal resistance caused by the void resulting in deterioration of performance of the power semiconductor module.

In order to reduce the void on the solder joint surface, Patent Document 2 discloses use of a solder material formed to a frame shape. In the method, a frame-shaped solder material is disposed between the joint surface of a first joining member and the joint surface of a second joining member and then fused to confine the atmospheric gas within the space at the joining region formed by the first joining member, the second joining member, and the molten solder material. The gas confined in a void in this additional step blows outwardly with a great force in the subsequent decompression step, resulting in reduction of the void included in the solder.

[Patent Document 1]
Japanese Unexamined Patent Application Publication No. 2009-272554

[Patent Document 2]
Japanese Unexamined Patent Application Publication No. 2006-116564

The inventors of the present invention have made extensive studies about application of the conventional soldering methods mentioned above to the use of the solder material of the tin-high antimony system and have found the following problems. When the soldering method disclosed in Patent Document 1 was first applied to the solder material of tin-high antimony system, which forms a thicker oxide film on the surface than traditional solder materials, the wide surface area of the solder sheet having protrusions thereon increased the amount of oxide film in the solder and made sufficient reducing effect impossible only by increasing the area contacting hydrogen gas. As a result, a void was generated due to the oxide film remained on the joint surface between the semiconductor chip and the solder, deteriorating the joint condition.

When the soldering method disclosed in Patent Document 2 was applied to the solder material of tin-high antimony system, which exhibits higher viscosity than the traditional solder materials, the step to confine the atmospheric gas within the solder rather held the gas in the solder, generating a void.

SUMMARY OF THE INVENTION

The present invention has been made in view of the foregoing and an object of the present invention is to provide a method of soldering an insulated circuit board and an object, for example a semiconductor chip, using a tin-high antimony solder material in a condition with little void and a stable joint.

To accomplish the above objective, an aspect of the present invention comprises steps of: preparing a solder plate having a U-shape; mounting the solder plate on a substrate; mounting a semiconductor chip on the solder plate; fusing the solder plate in a reducing gas atmosphere; and reducing a pressure of the reducing gas to a pressure lower than the atmospheric pressure when melting the solder plate.

In this method, the soldering process between an insulated circuit board and a semiconductor chip is conducted using a solder plate with a U-shape and a reduced surface area, and composed of a tin-high antimony solder material, which would produce a thick surface oxide film and exhibit poor wettability. Nevertheless, the method of the invention generates a good solder joint surface with little oxide film and scarcely including voids.

In addition, a configuration of the semiconductor chip placed on the solder plate with U-shape before fusing the solder creates a gap between the central region of the lower surface of the joint area of the semiconductor chip and the insulated circuit board to increase a contact area with hydrogen gas, enhancing a cleaning effect for the solder joint surface due to reducing action of the hydrogen gas. A state of molten solder after heating from the laminated configuration supplies a solder that is free of oxide and exhibiting good wettability into the central region of the solder joint surface of the semiconductor chip where the amount of heat is large in an actual operating state of the semiconductor device. Consequently, the central region of the solder joint surface includes little void and exhibits good solder joint property, thereby reducing the thermal resistance. Therefore, the full performance of the semiconductor chip can be utilized.

DETAILED DESCRIPTION OF THE INVENTION

The following describes in detail a method of manufacturing a semiconductor device according to some preferred embodiments of the invention with reference to accompanying drawings. Common constructions throughout the embodiments are given the same symbols and repeated descriptions thereon are omitted.

The invention is not limited to the embodiment described below but can be applied to various manufacturing methods without departing from the spirit and scope of the invention.

Figure 1:
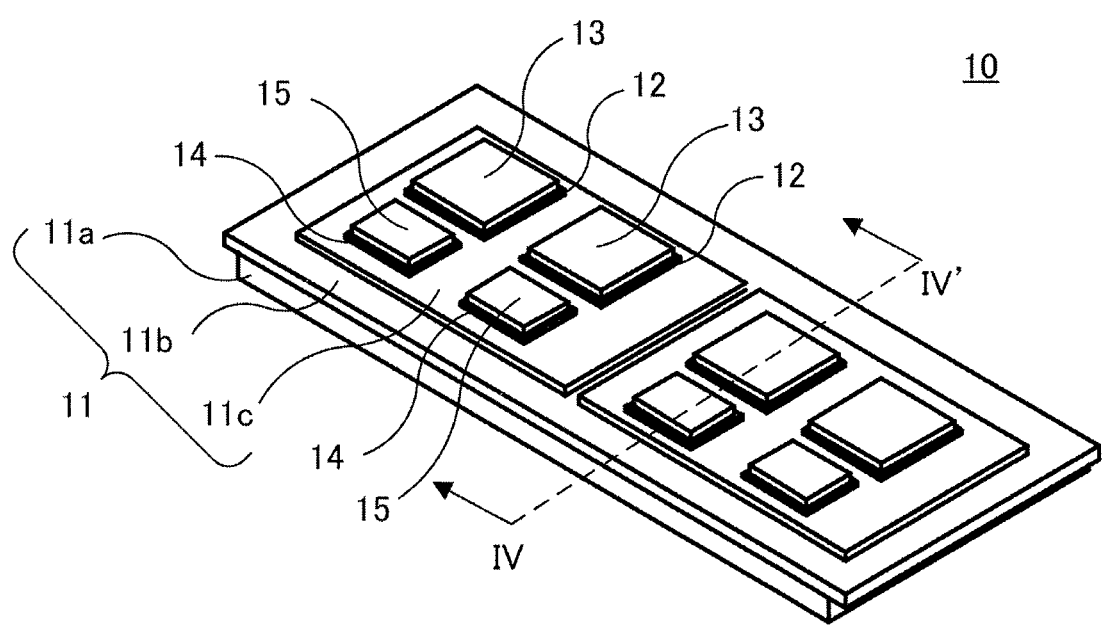
FIG. 1 is a perspective view of an overall power cell unit before fusing solder in an embodiment of the present invention.

FIG. 1 is a perspective view of an overall structure of an object to be soldered before fusing solder in a method of manufacturing a semiconductor device according to an embodiment of the present invention. A power cell unit shown in FIG. 1 has a first solder plate 12 and a second solder plate 14 placed on a specified joint surface on an insulated circuit board 11 for electrically and thermally joining the insulate circuit board 11 with a first semiconductor chip 13 and a second semiconductor chip 15. The first semiconductor chip 13, for example an IGBT, is placed on the first solder plate 12, and the second semiconductor chip 15, for example a diode, is placed on the second solder plate 14.

The insulated circuit board 11 comprises an insulator plate 11b made of an insulator material such as ceramics and a radiation plate 11a made of copper or aluminum laminated beneath the insulator plate 11b. The insulated circuit board 11 further comprises a circuit plate 11c made of copper or aluminum laminated on the insulator plate 11b, the circuit plate 11c having an electric circuit pattern of a power semiconductor module. The insulated circuit board 11 is generally called a direct copper bonding (DCB) substrate or a metallic insulating substrate.

Figure 2:
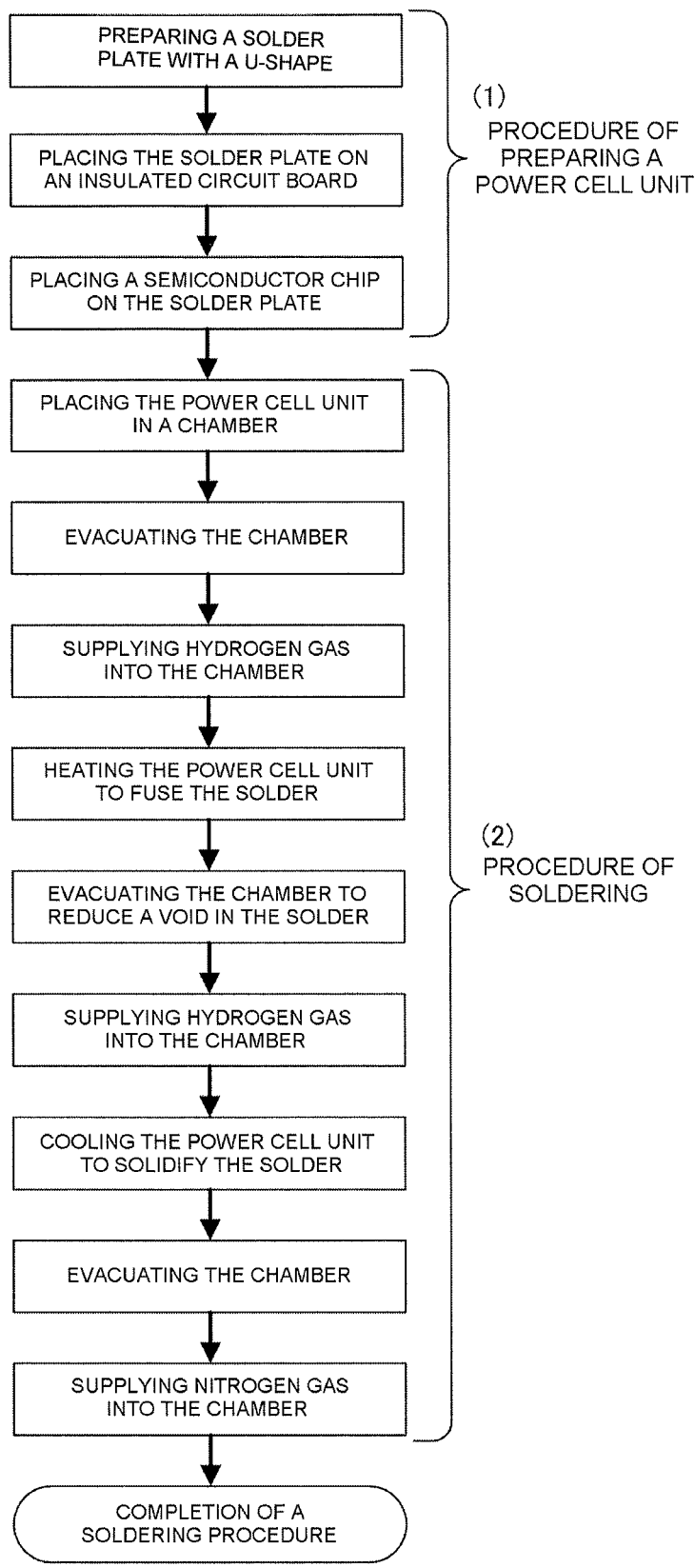
FIG. 2 is a flow chart of a method of manufacturing a semiconductor device according to an embodiment of the present invention.

FIG. 2 is a flow diagram of a method of manufacturing a semiconductor device according to an embodiment of the invention. A description is made here about "(1) the step of preparing a power cell unit" in FIG. 2.

First, a first solder plate 12 and a second solder plate 14 both having a shape of the letter U are prepared. Then, the first solder plate 12 and the second solder plate 14 are placed on specified joint surfaces of the insulated circuit board 11. Then, the first semiconductor chip 13 is placed on the first solder plate 12 and the second semiconductor chip 15 is placed on the second solder plate 14, completing preparation of the power cell unit 10.

Figure 3:
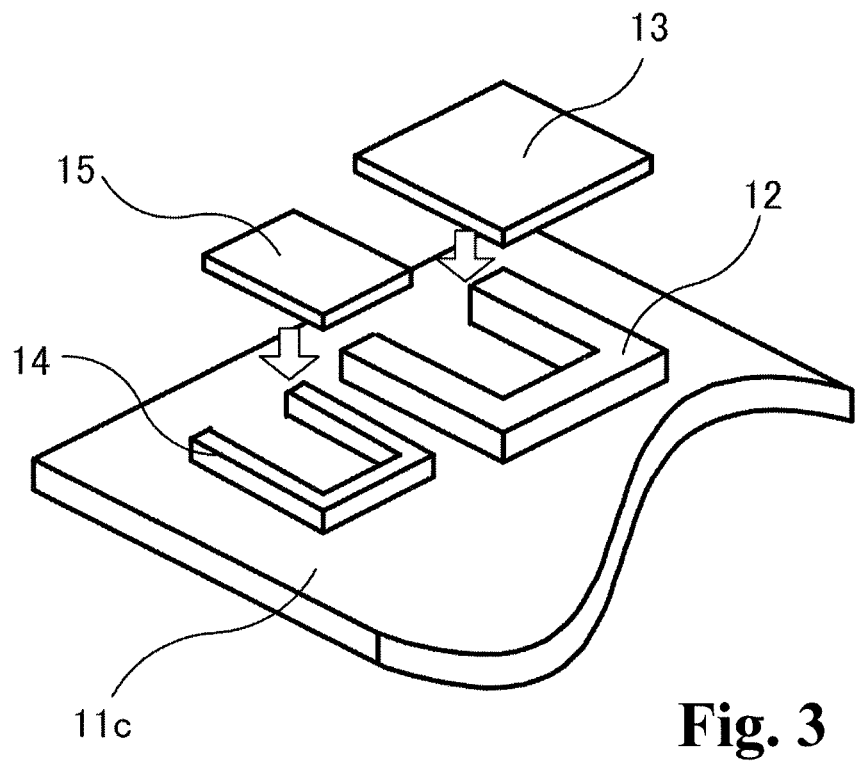
FIG. 3 is a perspective view of an essential part of the power cell unit before placing semiconductor chips in an embodiment of the present invention.
Figure 4:
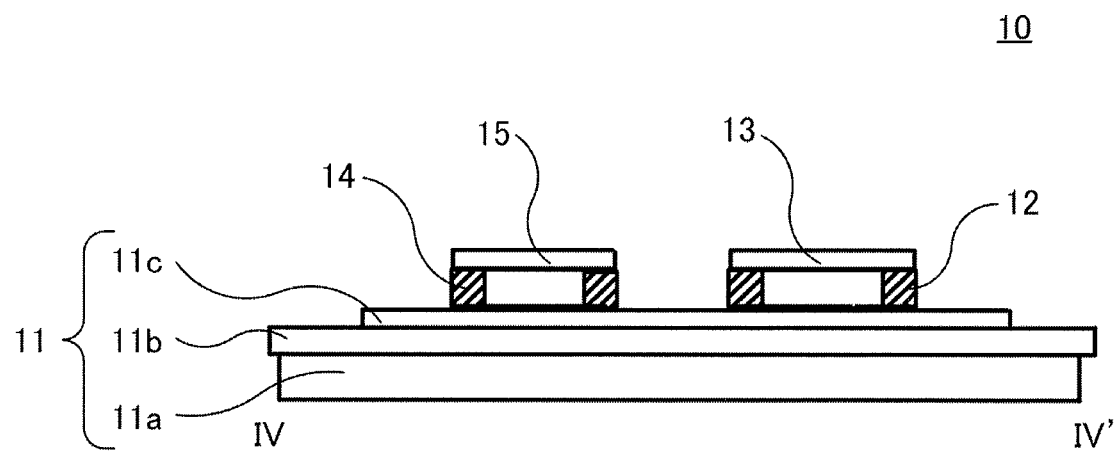
FIG. 4 is a sectional view of the power cell unit before fusing the solder in an embodiment of the present invention.

FIG. 3 is a perspective view of an essential part of the power cell unit before placing semiconductor chips, which are the objects to be soldered, in an embodiment of the present invention. FIG. 4 is a sectional view cut along the line IV-IV' in FIG. 1. As shown in FIGS. 3 and 4, the first solder plate 12 and the second solder plate 14 have dimensions adjusted to the outlines of the first semiconductor chip 13 and the second semiconductor chip 15. The central portion and one side of the solder plates have been cut off to form a planar shape of the letter U.

The width of the frame of the first solder plate 12 and the second solder plate 14 is preferably in the range of 1 to 2 mm in order to facilitate picking up the solder plate with a mounter. The thickness of the solder plate is determined from the volume and surface area of the solder plate based on the necessary thickness of the solder in the molten and joining state. When a semiconductor chip of outline dimensions of 10 mm×10 mm is joined with a solder thickness of 0.1 mm, the solder plate is preferably formed with a thickness of 0.25 mm and a frame width of 1.5 mm.

A solder plate having the planar shape of the letter U, as compared with a solder plate having a square plate shape employed in conventional soldering method, has a surface area reduced by 20% to 40% in the same volume. Thus, an amount of oxide film generated on the surface of the solder is also reduced. A solder plate with the planar shape of the letter U can be readily handled in picking up action than three individual elongated solder plates. The solder plate in the method according to the embodiment of the invention is made of a solder material of a tin-high antimony system as described previously (the tin-high antimony system is the solder alloy comprise high amount of Sb in addition to Sn as a main component). This material is superior to traditional solder materials such as a lead-free tin-silver solder material in mechanical joint strength, which contributes to achieve a power semiconductor module exhibiting high strength and high heat resistance. Although the material used in the embodiment is inferior to traditional solder materials in the thickness of the oxide film formed on the surface and the wettability of the solder, the surface area is reduced by forming the solder plate in a planar shape of the letter U, which significantly reduces the amount of oxide film.

Figure 5:
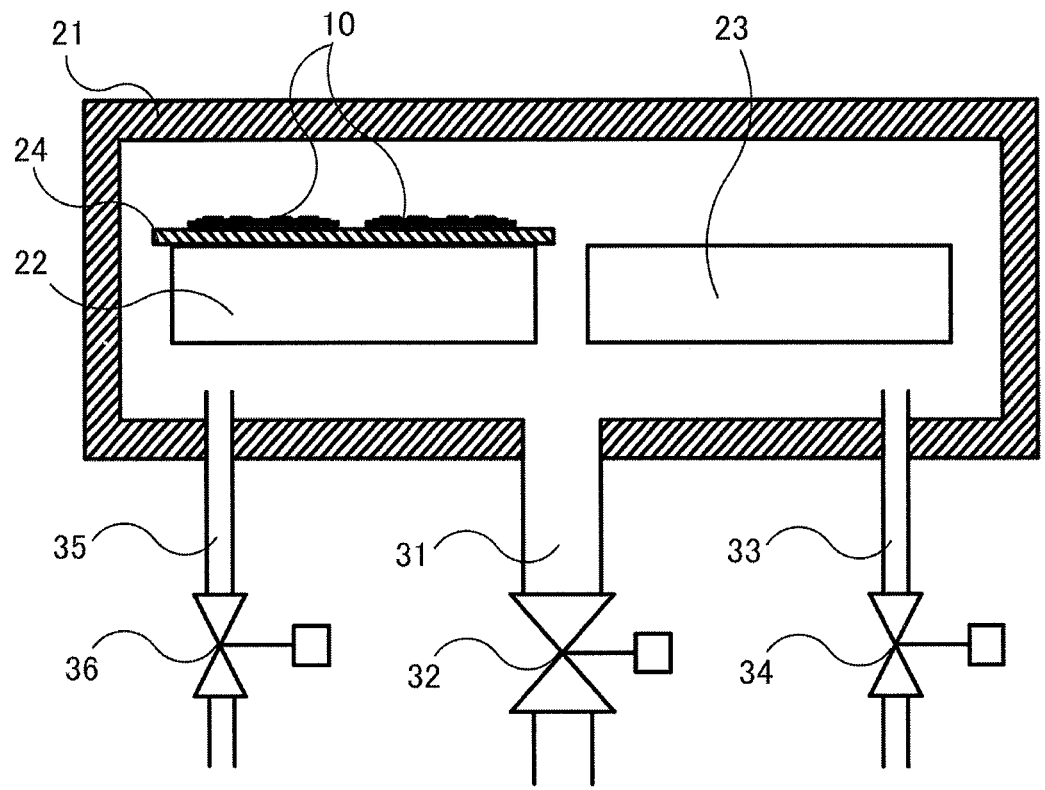
FIG. 5 shows a construction of essential parts of a soldering device in an embodiment of the present invention.

FIG. 5 shows a schematic construction of an essential part of soldering equipment used in the method of manufacturing a semiconductor device according to an embodiment of the present invention. The equipment comprises a heating plate 22 including a heater and other heating means (not indicated in the figure) and a cooling plate 23 including a cooling means using cooling water (not indicated in the figure) placed in a chamber 21 that can maintain airtightness.

A transport mechanism (not indicated in the figure) is provided that moves to and from the heating plate 22 and the cooling plate 23 transporting a transport tray 24 that is made of a carbon material having a high thermal conductivity. The transport tray 24 can convey a multiple of the power cell units 10 described earlier with reference to FIGS. 1, 2, and 3.

The chamber 21 connects to a vacuum pump (not indicated in the figure) for evacuating atmospheric gas in the chamber 21 through an exhaust pipe 31 and an exhaust valve 32. The chamber also connects to a hydrogen gas supplying mechanism (not indicated in the figure) for supplying hydrogen gas into the chamber 21 through a hydrogen gas supplying pipe 35 and a hydrogen gas supplying valve 36, the hydrogen gas being supplied for a reducing gas in the soldering process. The chamber 21 further connects to a nitrogen gas supplying mechanism (not indicated in the figure) for supplying nitrogen gas into the chamber 21 through a nitrogen gas supplying pipe 33 and a nitrogen gas supplying valve 34, the nitrogen gas being supplied for a substituting gas in an opening process of the chamber 21. The chamber 21 is provided with a vent pipe (not indicated in the figure) to prevent the chamber 21 from positively pressurized with the reducing gas in the processes of soldering the power cell units.

The process flow using this soldering equipment will be described according to the "(2) soldering steps" in the flow diagram for manufacturing a semiconductor device in FIG. 2.

A power cell unit(s) 10 is mounted on the transporting tray waiting on the cooling plate 23 in the chamber 21 in an opened state, and then the chamber 21 is shut off. After that, the vacuum pump starts operation and upon opening the exhausting valve 32, the gas in the chamber 21 is evacuated through the exhaust pipe 31 and a vacuum state is produced in the chamber 21. Then the exhaust valve 32 is closed and the hydrogen gas supply valve 36 is opened to supply hydrogen gas into the chamber 21. Thus the atmospheric gas in the chamber 21 is replaced with the hydrogen gas. At the same time, the vent valve is released to avoid a positively pressurized state in the chamber 21. Then, the transport mechanism moves the transport tray 24 onto the heating plate 22 to heat the power cell units 10.

When the power cell units 10 placed on the transport tray 24 are heated and the first solder plate 12 and the second solder plate 14 reaches a melting temperature, the hydrogen gas supplying valve 36 is closed and at the same time the exhaust valve 32 is opened again to exhaust the gas in the chamber 21 and produce a vacuum state. This vacuum state removes, in order to reduce a void, the gas in the solder plate 12 interposed between the first semiconductor chip 13 and the insulated circuit board 11, and the gas in the solder plate 14 interposed between the second semiconductor chip 15 and the insulated circuit board 11. After the vacuum state is produced in the chamber 21, the exhaust valve 32 is closed again and the hydrogen gas supplying valve 36 is opened to supply the hydrogen gas into the chamber 21 and conduct a reducing process.

After a certain period of time, the transporting tray 24 is moved to the cooling plate 23 to cool the power cell units 10. The hydrogen gas supplying valve 36 is closed and at the same time the exhaust valve 32 is opened to exhaust the hydrogen gas from the chamber 21. When the hydrogen gas in the chamber 21 is thoroughly exhausted, the exhaust valve 32 is closed and the nitrogen gas supplying valve 34 is opened to fill the chamber with the nitrogen gas. Then the chamber 21 is opened and the power cell units 10 are taken out. The heating in the hydrogen gas atmosphere allows direct reduction of the joint surfaces of the insulated circuit board 11, the first semiconductor chip 13, and the second semiconductor chip 15 before the solder melts. Thus, cleaning of the surfaces is performed. In the embodiment in particular, due to the planar shape of the letter U, the hydrogen gas extends over the central parts of the joint surfaces of the insulated circuit board 11, the first semiconductor chip 13, and the second semiconductor chip 15 before the solder melts. Therefore, the cleaning effect on the surfaces is enhanced.

Figure 6A:
FIGS. 6A and 6B show SAT images obtained in soldering experiments according to a method of conventional technology (FIG. 6A) and a method of an embodiment of the invention (FIG. 6B).
Figure 6B:

FIGS. 6A and 6B are images of scanning acoustic tomography (SAT) obtained in the experiment that was conducted for solder-joining a semiconductor chip and an insulated circuit board using a Sn-13 wt % Sb solder plate according to the soldering process in the method of the invention. The observed field of each of the images is over whole the solder-joined surface. The dark part indicates solder and the white part indicates a void.

FIG. 6A shows a SAT image obtained when a traditional square-shaped solder plate was placed between the insulating circuit board and the semiconductor chip and heated to melt and then the vacuum chamber 21 was evacuated. Because a solder plate punched to a square shape is used, void was created on the surface where the back surface of the semiconductor chip is in contact with the tin-high antimony solder material. The void shows that an oxide film generated on the surface of the tin-high antimony solder material appeared on the boundary face in the back surface of the semiconductor chip, deteriorating joining performance.

FIG. 6B shows a SAT image obtained when a solder plate having a planar shape of the letter U according to the invention was placed between the insulating circuit board and the semiconductor chip and heated to melt and then the vacuum chamber 21 was evacuated.

FIG. 6B, similarly to FIG. 6A, is a SAT image obtained when the solder plate having a planar shape of the letter U was placed between the insulating circuit board and the semiconductor chip and heated to melt on the heating plate, and then the chamber 21 was evacuated. No void is observed in the inside region of the back surface of the semiconductor chip, except that a little void exists in a part of the peripheral region of the semiconductor chip.

The reason for these observations is given in the following. The oxide film formed on the surface of the solder plate of the tin-high antimony having a planar shape of the letter U hardly flows out even in the heated and molten state, and remains at the outer periphery of the joint surface with the planar shape of the letter U before melting. On the other hand, in the central region of the joint surface, solely the molten solder material free of oxide film flows out and expands in a wet condition. Under this condition, the remained gas in the solder plate is exhausted. Thus, the evacuation process described previously produces a solder joint surface with reduced void.

The use of the solder plate with a planar shape of the letter U has eliminated the void remained in the central region of the joint surface that would be generated in the case of a solder plate with a square shape.

An antimony content of a tin-high antimony solder material in the present invention is preferably in the range of 8 wt % to 15 wt %. A solder material with a tin content below 8 wt % has a viscosity nearly equal to that of traditional tin-based alloy solder materials. Thus, a void can be eliminated by a degassing process in a molten state of the solder material even without applying the planar shape of the letter U. On the other hand, a solder material containing antimony in an amount larger than 15 wt % exhibits brittleness, deteriorating the reliability of a semiconductor device after solder joining. In addition, a solder material containing antimony more than 15 wt % has a melting point higher than 300° C. Accordingly, the temperature in the soldering process must be raised. However, the semiconductor chips are not heat resisting at such high temperatures. Therefore, the temperature margin decreases between the heat resistant temperature and the temperature of the soldering process, which deteriorates electrical performance of the semiconductor chips.

DESCRIPTION OF SYMBOLS

10: power cell unit
11: insulated circuit board
11a: radiation plate
11b: insulator plate
11c: circuit plate
12: first solder plate
13: first semiconductor chip
14: second solder plate
15: second semiconductor chip
21: chamber
22: heating plate
23: cooling plate
24: transport tray
31: exhaust pipe
32: exhaust valve
33: nitrogen gas supply pipe
34: nitrogen gas supply valve
35: hydrogen gas supply pipe
36: hydrogen gas supply valve

What is claimed is:

1. A method of manufacturing a semiconductor device, comprising the steps of:
    preparing a solder plate having three side portions, a space surrounded by the three side portions in a central portion thereof, and an opening portion for communicating with the space to thereby form a U-shaped solder plate;
    mounting the solder plate on a substrate;
    mounting a semiconductor chip on the solder plate;
    fusing the solder plate in a reducing gas atmosphere; and
    reducing a pressure of the reducing gas atmosphere to a pressure lower than an atmospheric pressure when melting the solder plate,
    wherein the space in the central portion of the solder plate is arranged to communicate with the reducing gas atmosphere through the opening portion.

2. The method of manufacturing a semiconductor device according to claim 1, wherein the solder plate comprises tin and antimony.

3. The method of manufacturing a semiconductor device according to claim 2, wherein the solder plate comprises antimony in an amount of 8 to 15 wt %.

4. The method of manufacturing a semiconductor device according to claim 1, wherein the reducing gas is hydrogen gas.

5. The method of manufacturing a semiconductor device according to claim 1, further comprising a step of cutting off the central portion from a rectangular solder plate so that one side portion of the rectangular solder plate communicates with the central portion to form the U-shaped solder plate.

6. The method of manufacturing a semiconductor device according to claim 5, wherein the U-shaped solder plate is cut such that a surface area of the U-shaped solder plate is reduced by 20% to 40% relative to a rectangular solder plate in a same volume.

7. The method of manufacturing a semiconductor device according to claim 6, wherein the three side portions of the solder plate have a width in a range of 1 to 2 mm.

8. The method of manufacturing a semiconductor device according to claim 5, wherein the three side portions have an outer shape corresponding to an outer shape of the semiconductor chip.

* * * * *